(12) United States Patent
Wuidart

(10) Patent No.: US 7,178,067 B2
(45) Date of Patent: Feb. 13, 2007

(54) SECURE EEPROM MEMORY COMPRISING AN ERROR CORRECTION CIRCUIT

(75) Inventor: Sylvie Wuidart, Pourrieres (FR)

(73) Assignee: STMicroelectronics SA, Montrouge (FR)

( * ) Notice: Subject to any disclaimer, the term of this patent is extended or adjusted under 35 U.S.C. 154(b) by 460 days.

(21) Appl. No.: 10/317,005

(22) Filed: Dec. 11, 2002

(65) Prior Publication Data

US 2003/0126513 A1 Jul. 3, 2003

Related U.S. Application Data

(63) Continuation of application No. PCT/FR01/01634, filed on May 28, 2001.

(30) Foreign Application Priority Data

Jun. 13, 2000 (FR) .................................. 00 07479

(51) Int. Cl.
*G06F 11/00* (2006.01)

(52) U.S. Cl. ....................................................... 714/42

(58) Field of Classification Search ................ 714/758, 714/52, 768, 753, 702, 42

See application file for complete search history.

(56) References Cited

U.S. PATENT DOCUMENTS

| 4,839,628 A | * | 6/1989 | Davis et al. | ................ 340/7.41 |
|---|---|---|---|---|
| 4,930,129 A | * | 5/1990 | Takahira | ..................... 714/766 |
| 5,432,802 A | * | 7/1995 | Tsuboi | ........................ 714/710 |
| 5,535,162 A | | 7/1996 | Uenoyama | .................. 365/200 |
| 5,818,771 A | * | 10/1998 | Yasu et al. | .................. 365/195 |
| 5,933,436 A | * | 8/1999 | Tanzawa et al. | ............ 714/762 |
| 5,996,096 A | * | 11/1999 | Dell et al. | .................. 714/710 |
| 5,999,447 A | * | 12/1999 | Naura et al. | ........... 365/185.04 |
| 6,108,236 A | * | 8/2000 | Barnett | .................. 365/185.09 |
| 6,160,734 A | * | 12/2000 | Henderson et al. | .... 365/185.04 |

FOREIGN PATENT DOCUMENTS

| DE | 19630918 | 10/1997 |
|---|---|---|
| FR | 2687811 | 8/1993 |

OTHER PUBLICATIONS

Harvey F. Hoffman et al., An Error Detection and Management Approach for Nonvolatile Electrically Ersable and Programmable Read Only Memory (EEPROM) Systems United Technologies Norden Systems, 0-7803-1290-2Q3 $3.00 01993 IEEE.*

* cited by examiner

*Primary Examiner*—Robert W. Beausoliel
*Assistant Examiner*—Elmira Mehrmanesh
(74) *Attorney, Agent, or Firm*—Lisa K. Jorgenson; Allen, Dyer, Doppelt, Milbrath & Gilchrist, P.A.

(57) ABSTRACT

An electrically erasable and programmable memory includes at least one non-erasable secured zone. Detection and/or correction of read errors in the secured zone is provided by recording redundant bits in the secured zone and delivering an error signal and/or a bit having the majority value when the redundant bits read in the secured zone are not equal.

49 Claims, 4 Drawing Sheets

SECURE EEPROM MEMORY COMPRISING AN ERROR CORRECTION CIRCUIT

RELATED APPLICATION

The present application is a continuation of International Application No. PCT/FR01/01634 filed on May 28, 2001, the entire disclosure of which is incorporated herein by reference.

FIELD OF THE INVENTION

The present invention relates to EEPROMS comprising a non-erasable secure area, particularly EEPROMS for smart card integrated circuits. The present invention relates more particularly to the integration of an error correction circuit into this type memory.

BACKGROUND OF THE INVENTION

Electrically erasable and programmable memories in smart card integrated circuits are generally equipped with a programmable but non-erasable protected storage area intended to receive OTP bits, i.e., bits whose value can only be changed in one direction. Thus, by conventionally allocating the value 0 to an erased bit and the value 1 to a programmed bit, an OTP bit is distinguished from an ordinary bit in that it can be set to 1 but can no longer be reset to 0.

OTP bits are used in various applications related to securing data in memories, and are generally used as consumable tokens or to form irreversible counters. For example, OTP bits can be used to authorize access to certain storage areas during the steps of customizing a smart card, then they are all set to 1 when the smart card is marketed so as to block access to sensitive storage areas where secret codes are located, for example. The irreversibility of the programming of a memory cell comprising an OTP bit is therefore necessary to obtain a certain degree of security in smart card integrated circuits.

Furthermore, with the development of technologies and the increasingly advanced miniaturization of integrated circuits, it has become desirable to equip EEPROMS with a circuit allowing errors occurring in the storage of bits to be detected. These errors are generally due to a deterioration in the non-volatile electrical characteristics of memory cells (threshold voltage), and are more frequent in latest generation memories comprising floating-gate transistors having very short gates of less than 0.35 micrometers. A deterioration in the non-volatile electrical characteristics of a memory cell can result in the reading of an erroneous bit, such as the reading of a 0 although a 1 had initially been recorded.

To overcome this drawback, EEPROMS are equipped with an error correction circuit that associates to each binary word recorded an error correction code, or ECC code, generated for example by the Hamming algorithm that is well known to those skilled in the art. With each change of a bit of a binary word, this method requires the recording in the memory of a new ECC code associated to the binary word considered. However, this operation proves to be difficult in storage areas containing OTP bits since the recording of a new ECC code generally requires the erasing and the programming of memory cells receiving the code, while the memory cells of an OTP area cannot be erased.

SUMMARY OF THE INVENTION

In view of the foregoing background, an object of the present invention is to detect and/or correct read errors in the non-erasable secure area of a memory.

Another object of the present invention is to provide a memory comprising both a secure OTP area and an error detection and/or correction system that covers the entire memory.

These objects are achieved by providing a method for detecting and/or correcting errors, for the OTP area of a memory, which does not require memory cells to be erased in order to be implemented.

More particularly, the present invention is based on the observation that an error detection technique based upon providing a redundancy of bytes in a memory is applicable at bit level to OTP bits since it does not require memory cells to be erased when it is applied to OTP bits. This is not apparent at first sight but becomes clear when an example is considered. Therefore, an OTP storage area will be considered for example that only comprises by default OTP bits at a 0 (bits not used or not consumed). The use or consumption of an OTP bit corresponds to the fact of programming N memory cells (N OTP bits at a 1) without it being necessary to erase memory cells, as in an EEPROM-type device in which the programming of memory cells is done individually. This redundancy of OTP bits according to the present invention can be provided with or without interleaving OTP bits.

Therefore, a first aspect of the present invention is to provide for the OTP area of a memory a method for detecting and/or correcting read errors based on a redundancy of bits and on the delivery of an error signal and/or a majority value bit when-redundant bits are not equal.

In contrast, the usual technique for protecting OTP bits from recording errors is to multiply the number of OTP bits stored in a memory so that at least one OTP bit has a desired value. This technique therefore bears no relation with an error detection and/or correction based on a comparison of the values of the redundant bits.

U.S. Pat. No. 5,999,447 shows this classical technique. An OTP area comprises a first group of n redundant OTP bits and a second group of n redundant inverted OTP bits. A differential read circuit [DIFF-SENSE] represented in FIG. 3 of the referenced patent simultaneously reads the first group of redundant bits and the second group of redundant inverted bits, and delivers only one bit [BIT]. This differential read circuit is not sensitive to a majority value nor is it able to deliver an error signal. It is sufficient that at least one memory cell be on for a current to circulate in the sense amplifier.

According to this same principle, a flash memory [2] is disclosed in French Patent No. 2,687,811 that is divided into sectors wherein each sector comprises an erasure management field [11] comprising a redundancy of erasure validating flags [D7, D6], and a redundancy of defective sector indicator flags [D5, D4]. In this patent, there is no error detection and/or correction or majority value determination. If, for example, the significant value of a flag is 1, it is sufficient that at least one flag be at a 1 in a redundancy group for the flag to be considered as equal to 1.

Another aspect of the present invention is to provide a method for correcting read errors, for the non-OTP part of a memory, using Hamming code type error correction codes.

Yet another aspect of the present invention is to combine in a memory a first error detection and/or correction circuit operating according to the principle of simple or majority redundancy and a second error correction circuit using error correction codes, by selecting one of these circuits depending on the address applied to the memory. The first circuit is dedicated to an OTP area of the memory, and the second is dedicated to the erasable areas of the memory.

Therefore, the present invention provides an electrically erasable and programmable memory comprising at least one programmable and non-erasable secure area and one erasable and programmable non-secure area. A first error detection and/or correction circuit is dedicated to the secure area, and comprises means for recording redundant bits in the secure area, and means for receiving redundant bits read in the secure area and delivering an error signal and/or a majority value bit when the redundant bits are not equal.

According to one embodiment, the memory comprises a second error correction circuit dedicated to the erasable and programmable area of the memory, arranged to record error correction codes in the memory together with recording data bits, and to detect, as necessary, the presence of an erroneous bit in a bit string read in the memory, and to correct the erroneous bit.

According to one embodiment, the memory comprises a selection circuit arranged to deliver a signal for selecting the first or the second error detection and/or correction circuit, depending on the value of an address applied to the memory.

The selection circuit may be a circuit for protecting the secure area, arranged to deliver a signal for inhibiting an erasing operation when the address applied to the memory corresponds to the secure area.

According to one embodiment, the memory comprises: strings of M bits comprising N1 data bits and N2 error correction code bits in the erasable areas of the memory, strings of M bits comprising M/N3 redundant bits in the non-erasable secure area, with N3 being a redundancy rate.

According to one embodiment, the first error detection and/or correction circuit dedicated to the secure area is arranged to program at least two bits equal to the bit to be recorded when a bit must be programmed in the secure area, and read the redundant bits corresponding to the bit to be read when a bit must be read in the secure storage area, and deliver an error signal when the redundant bits are not equal.

According to one embodiment, the first error detection and/or correction circuit dedicated to the secure area is arranged to program at least three bits equal to the bit to be recorded when a bit must be programmed in the secure area, and read the redundant bits corresponding to the bit to be read when a bit must be read in the secure storage area, and deliver a bit having the majority value out of the redundant bits read.

According to one embodiment, the first error detection and/or correction circuit dedicated to the secure area is arranged to interleave redundant bits.

The present invention also relates to an integrated circuit comprising an electrically erasable and programmable memory according to the present invention, and a portable electronic object comprising an integrated circuit comprising an electrically erasable and programmable memory according to the present invention.

BRIEF DESCRIPTION OF THE DRAWINGS

These and other objects, advantages and features of the present invention shall be explained in greater detail in the following description of a memory according to the present invention, given in relation with, but not limited to the following figures.

DETAILED DESCRIPTION OF THE PREFERRED EMBODIMENTS

Figure 1:
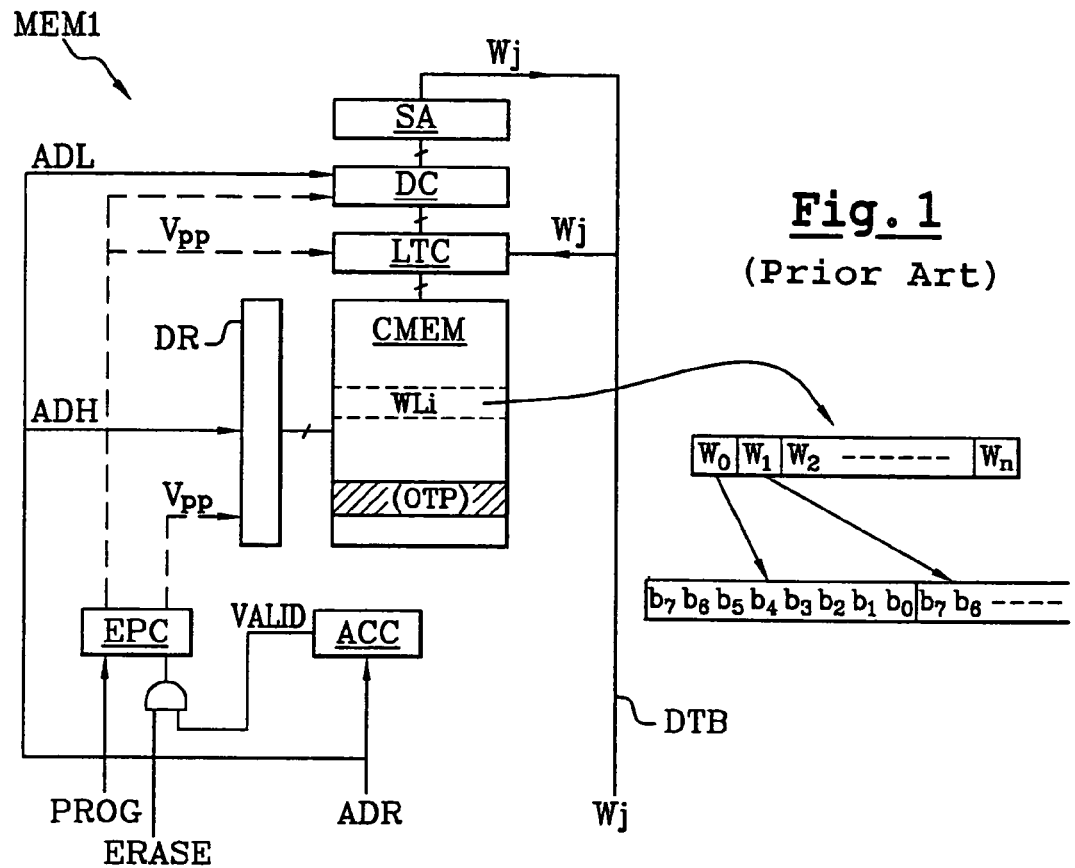
FIG. 1 represents an architecture of an EEPROM comprising a non-erasable secure area according to the prior art.

EEPROMS comprising a non-erasable secure area will initially be discussed. FIG. 1 represents in block form the classical architecture of a memory MEM1 comprising an OTP-type non-erasable secure area. The memory MEM1 comprises a memory array CMEM, a line decoder DR and a column decoder DC respectively receiving the most significant bits ADH and the least significant bits ADL of the addresses ADR applied to the memory. The memory also includes a circuit LTC for loading data, a read circuit SA and a circuit EPC for controlling erasing and programming operations of the memory array CMEM.

The memory array CMEM is made up of memory cells arranged in word lines $WL_i$ and in bit lines. The bit lines are arranged in columns to delimit in each word line $WL_i$ binary words $W_0$ to $W_N$ each comprising M bits, generally bytes comprising bits b7 to b0. The circuit LTC comprises a plurality of programming latches provided to store the bits of a word $W_j$ to be recorded in the memory. The circuit SA comprises sense amplifiers to read the bits of a word $W_j$ selected in the memory array CMEM. The circuit EPC receives signals at an input for programming PROG and erasing ERASE the memory, and delivers a high programming or erasing voltage Vpp on the order of 15 to 20V to the line decoder DR, to the column decoder DC and to the circuit DC.

When a binary word $W_j$ is be recorded in the memory, the recording address ADR of the word is applied to the memory. The bits b7 to b0 of the word $W_j$ are loaded into the circuit latches LTC and the signal ERASE is first applied to the circuit EPC that then sends the voltage Vpp to the line decoder DR for erasing cells designated by the address ADR. The programming signal PROG is then applied to the circuit EPC that sends the programming voltage Vpp to the column decoder DC and to the latches LTC.

In summary, the recording of a word $W_j$ therefore comprises a step of collective erasing of cells designated by the address ADR that are set to 0, (the 0 being conventionally chosen to designate the erased status) followed by a step of individual programming of cells that must contain bits at a 1 of the new word $W_j$. These cells are automatically selected by the latches of the circuit LTC.

In this memory, an OTP-type non-erasable secure area is obtained in a straightforward manner by an address control circuit ACC receiving at an input the addresses ADR applied to the memory and delivering a signal VALID for validating erasing operations. The signal VALID is set to 0, for example, by the circuit ACC when an address corresponding to the OTP area is applied to the memory, which inhibits the application of the signal ERASE to the circuit EPC, as schematically represented on FIG. 1 by an AND gate receiving at an input the signals ERASE and VALID. The output of which delivers the signal ERASE to the circuit EPC.

Figure 2:
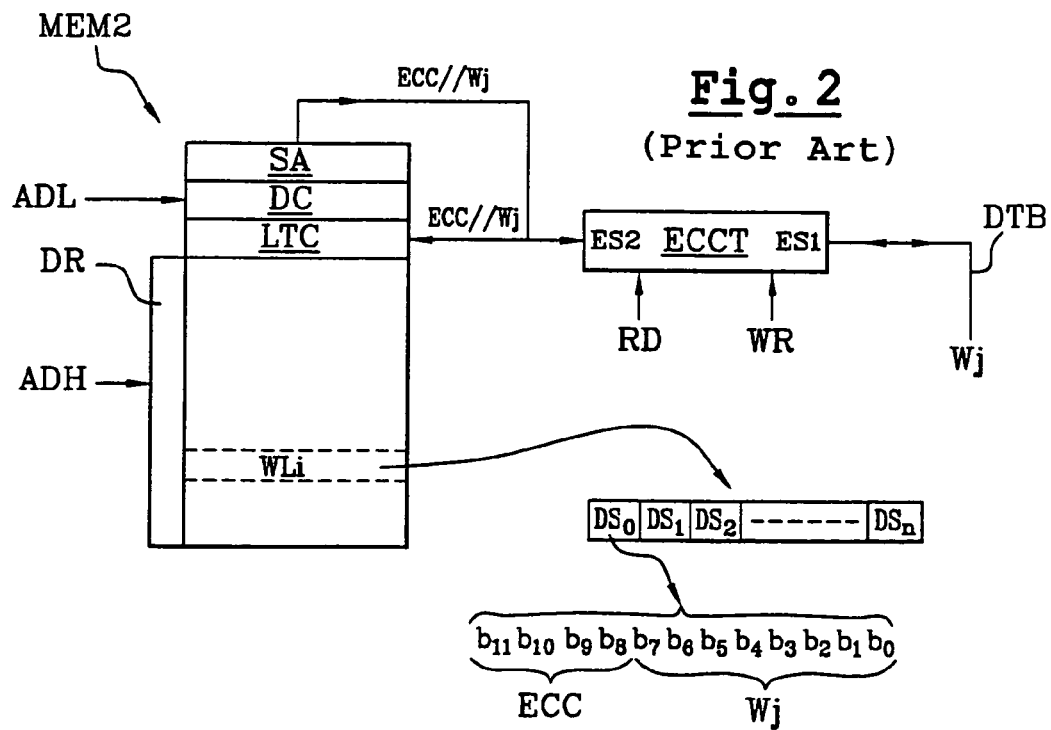
FIG. 2 represents an architecture of an EEPROM comprising an error correction circuit according to the prior art.

EEPROMS comprising an error correction circuit will now be discussed. FIG. 2 represents in block form the architecture of a memory MEM2 that is distinguished from the memory MEM1 in that it comprises an error correction circuit ECCT and does not comprise secure areas. The circuit ECCT has one input/output ES1 connected to the data bus DTB of the memory and one input/output ES2 connected to the input of the circuit LTC and to the output of the circuit SA (hereafter, one input/output will be designated an input or an output depending on the context of the description). The circuit ECCT receives a signal RD (Read) that is at a 1 during phases of reading the memory, and a signal WR (Write) that is at a 1 during phases of erasing or programming.

When a word $W_j$ must be recorded in the memory (WR=1), the word is applied to the input ES1 of the circuit ECCT the output ES2 of which delivers the word $W_j$ linked with an error correction code $ECC_j$. The linked $ECC_j//W_j$ forms a bit string $DS_j$ that is loaded into the circuit LTC in order to be recorded in the memory array CMEM. The code $ECC_j$ is, for example, a Hamming code of four bits allowing one erroneous bit out of twelve to be detected and corrected, such that the bit string $DS_j$ comprises twelve bits:

$Es_j$=b11 b10 b9 b8 b7 b6 b5 b4 b3 b2 b1 b0 out of which the bits b11 to b8 form the code $ECC_j$ and the bits b7 to b0 form the word Wj.

The memory MEM2 is therefore distinguished from the previous one in that the word lines $WL_i$ of the memory array CMEM comprise bit strings $DS_j$ ($DS_0$ to $DS_N$), each comprising a binary word $W_j$ and a code $ECC_j$. Therefore, when a bit string $DS_j$ is read in the memory by the circuit SA (RD=1), the circuit ECCT receives the bit string $DS_j$ at its input ES2 and delivers the eight data bits b7–b0 at its output ES1. The data bits are contained in the string $DS_j$, and one of these bits is corrected if a read error is detected.

As indicated above, providing a non-erasable secure area in this memory conflicts with the fact that the recording of a bit string comprising ECC codes cannot be done without first erasing the data receiving cells, since an error correction code can comprise bits at a 1 or at a 0 that bear no relation to the bits of the code previously recorded. The integration into a memory of an error correction circuit such as the circuit ECCT is therefore incompatible with providing a non-erasable OTP area.

Figure 3:
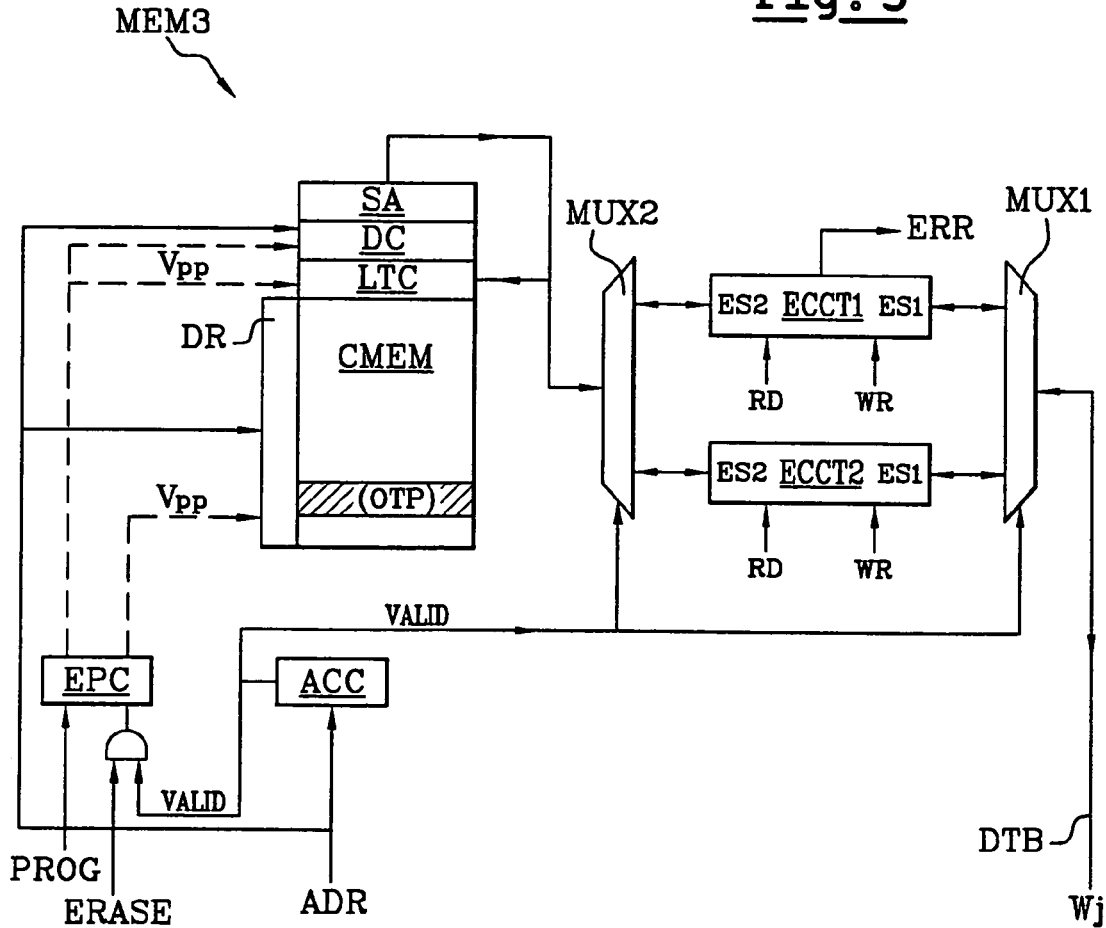
FIG. 3 represents an architecture of a memory according to the present invention comprising a non-erasable secure area and an error detection and/or correction system.

A memory according to the present invention will now be discussed. FIG. 3 shows a memory MEM3 according to the present invention that overcomes the inconveniences mentioned above. The general structure of the memory MEM3 conforms to that of memories MEM1 and MEM2 and will not be described again. It will be assumed here that the memory array CMEM of the memory MEM3 comprises, like that of the memory MEM2, bit strings $DS_j$ of 12 bits each.

The memory MEM3 is distinguished from memories MEM1, MEM2 in that it has both a secure OTP area and an error correction system covering the entire memory array CMEM, including the OTP area. This OTP area is erase-protected in a classical manner by an address control circuit ACC delivering the signal VALID that inhibits or validates the erasing operations (signal ERASE) depending on whether an address ADR applied to the memory corresponds or not to the OTP area.

According to the present invention, the memory MEM3 comprises a first error correction circuit ECCT1 dedicated to the management of read errors in the OTP area, and a second error correction circuit ECCT2 arranged in parallel with the first one, dedicated to the management of read errors in the rest of the memory array CMEM. Each of the circuits ECCT1, ECCT2 comprises two inputs/outputs ES1, ES2 and receives a signal RD at a 1 during periods of reading the memory and a signal WR at a 1 during periods of writing. The input/output ES1 of each circuit is connected to the data bus DTB of the memory through a multiplexer MUX1, and the input/output ES2 is connected to the data loading circuit LTC and to the read circuit SA through a multiplexer MUX2. The multiplexers MUX1, MUX2 receive the signal VALID at their selection input. The signal is delivered by the address control circuit ACC, and are arranged to select one of the two circuits ECCT1, ECCT2 depending on the value of this signal.

Thus, when an address ADR applied to the memory designates a bit string that is located in the OTP area, the circuit ECCT1 has its input/output ES1 connected to the data bus DTB and its input/output ES2 connected to the circuits LTC, SA. Conversely, when the address applied ADR does not correspond to the OTP area, it is the circuit ECCT2 that has its inputs/outputs ES1, ES2 connected to the data bus DTB and to the circuits LTC, SA.

The circuit ECCT2 is a classical error correction circuit conforming to the circuit ECCT described above. Therefore, in a write mode of the memory (WR=1), the circuit ECCT2 delivers bit strings at its output ES2. The bit strings comprises eight data bits b7–b0 copying a binary word $W_j$ received at the input ES1 and four bits b11–b8 forming an error correction code, such as a Hamming code, for example. In a read mode of the memory (RD=1), the circuit ECCT2 receives a bit string at its input ES2. The bit string comprises a code ECC and eight data bits b7–b0, which are delivered to the output ES1 possibly after correction of a bit if a read error is detected.

The circuit ECCT1 operates according to a different error correction principle, based on a redundancy of bits without coding. In the write mode of the memory (WR=1), the circuit ECCT1 delivers bits at its output ES2. The bits copy in a redundant manner the bits received at the input ES1. As the memory array CMEM is provided to record strings of twelve bits, the redundancy rate of the circuit ECCT1 is, for example, chosen to be equal to 3 to form three groups of four bits. Therefore, the circuit ECCT1 duplicates 4 bits b3 to b0 received at the input ES1 in twelve bits b12' to b0' delivered to the output ES2, which are linked to the bits b3 to b0 by the following relations:

b8'=b4'=b0'=b0 b9'=b5'=b1'=b1 b10'=b6'=b2'=b2 b11'=b7'=b3'=b3 that define a triple redundancy with interleaving of redundant bits b11' to b0'. The bits b11' to b0' are then loaded into latches of the circuit LTC, then they are recorded in the memory by a simple programming operation that does not require erasing memory cells if the rules of handling OTP bits are respected.

As an example, it will be assumed that the OTP area comprises a bit string equal to:

$$DS_j = 111011101110$$

By removing the redundancies, this bit string is equivalent to four tokens three of which have been used (bits at a 1), with one token remaining available (bit at a 0):

$$1110$$

To use the last token, the word 1111 is placed at the input ES1 of the circuit ECCT1 that then delivers the following redundant string at its output ES2:

$$DSj' = 111111111111$$

This bit string DSj' is loaded into the corresponding latches of the circuit LTC and is recorded in place of the previous bit string DSj. This operation only comprises the recording of three is in place of the three previous 0s, and only requires one step of programming the corresponding cells without erasing the previous bit string. Thus, it can clearly be seen that the recording of redundant OTP bits is not a problem in a non-erasable OTP area.

In the read mode of the memory (RD=1), the circuit ECCT1 receives at input ES2 a string of redundant bits b11'–b0' delivered by the read circuit SA, and delivers the four initial bits b3–b0 at the output ES1. A read error on a bit results in an inequality between the three redundant bits and the bit delivered at the output ES1 is the one that has the majority value out of the three bits read. It will be assumed as an example that the following bit string is delivered by the read circuit SA at the input ES1 of the circuit ECCT1:

$$DS_j = 011101100110$$

This bit string comprises a read error as three bits that should be equal (bits underlined) are not. The circuit ECCT1 then delivers the following bits at its output ES1:

$$0110$$

with the fourth bit equal to 0 as the 0 is the majority value in the three redundant bits. Furthermore, the circuit ECCT1 delivers an error signal ERR indicating that at least one bit read is erroneous.

Figure 4:
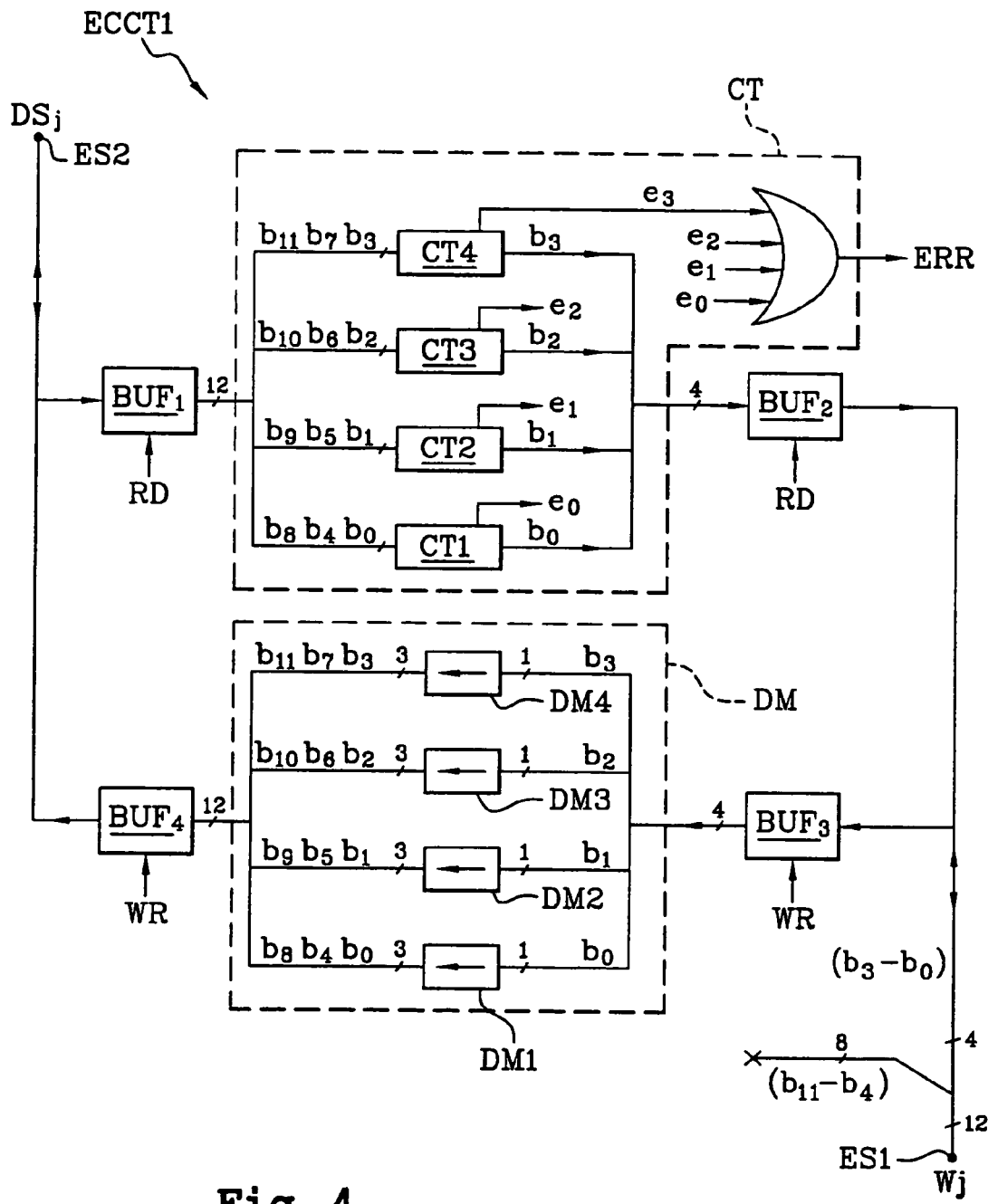
FIG. 4 represents the architecture of the error detection and/or correction circuit represented in block form in FIG. 3.

An embodiment of the circuit ECCT1 will now be discussed. FIG. 4 represents one embodiment of the circuit ECCT1. The circuit ECCT1 comprises a correction block CT and a redundancy block DM. The correction block CT is connected to the input ES2 through a buffer BUFL and is connected to the output ES1 through a buffer BUF2. The buffers BUFL, BUF2 are transparent when the signal RD is at a 1. The redundancy block DM is connected to the input ES1 through a buffer BUF3 and is connected to the output ES2 through a buffer BUF4. The buffers BUF3, BUF4 are transparent when the signal WR is at a 1.

The block DM comprises four demultiplexers DM1 to DM4 each having one input and three outputs. The three outputs are arranged to simultaneously copy the value of a bit presented at input. The circuit DM1 receives at an input the bit b0 of a bit string applied to the input ES1 and delivers the redundant bits b8', b4', b0'. The circuit DM2 receives at an input the bit b1 and delivers the bits b9', b5', b1'. The circuit DM3 receives the bit b2 and delivers the bits b10', b6', b2'. The circuit DM4 receives the bit b3 and delivers the bits b11', b7', b3'. The eight other bits present at the input ES1 are not used since the corresponding conductor tracks of the data bus are not connected to the circuit ECCT1.

The block CT comprises four error correction circuits CT1 to CT4 each receiving three redundant bits selected in a string of bits b11 to b0 delivered by the read circuit SA and applied to the input ES2. They are respectively bits {b8', b4' and b0'}, {b9' b5' b1'}, {b10' b6' b2'}, {b11' b7' b3'}. The blocks CT1 to CT4 deliver a corrected bit, respectively b0, b1, b2, b3, applied to the output ES1 through the buffer BUF2. Furthermore each circuit CT1 to CT4 delivers an error bit, respectively e0 to e3, when three redundant bits presented at input are not equal. The error bits are combined in an OR gate to form the error signal ERR delivered by the circuit ECCT1.

Figure 5:
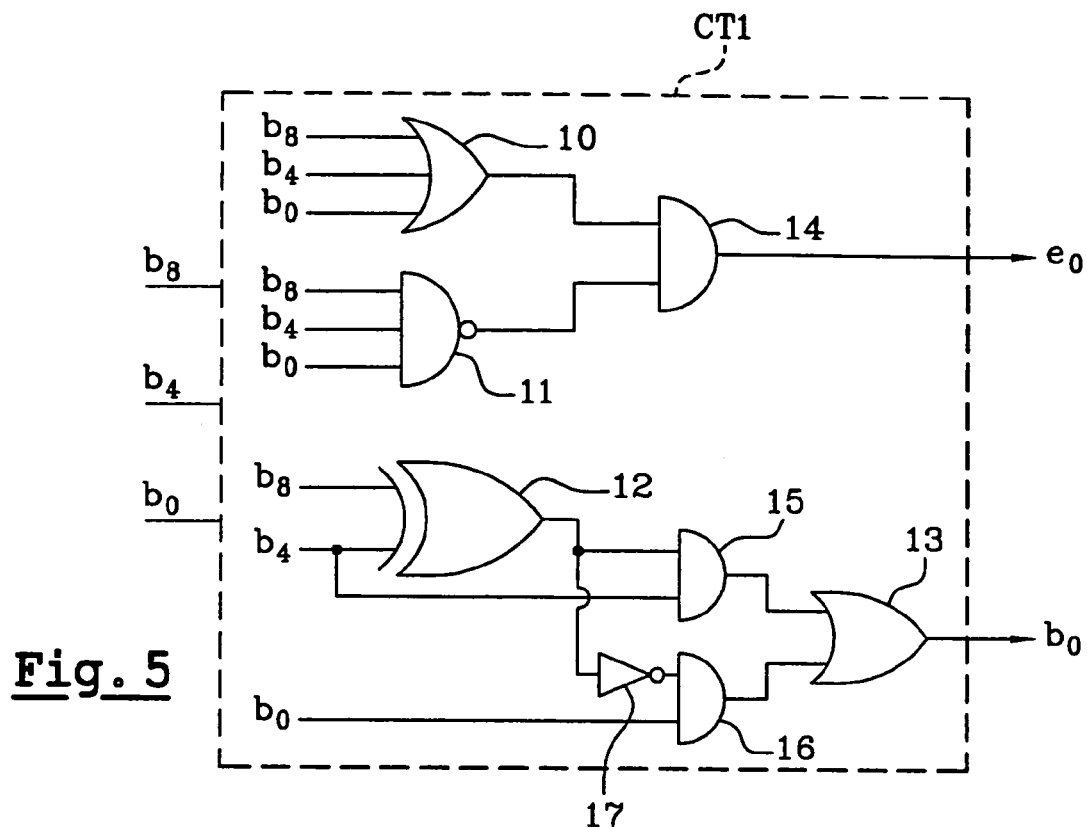
FIG. 5 is a logical diagram of an error correction element represented in block form in FIG. 4.

FIG. 5 represents an example of an embodiment of the correction circuit CT1, in the form of a logic circuit. The circuit CT1 comprises an OR gate 10 with three inputs, a NAND gate 11 with three inputs, an Exclusive OR gate 12 with two inputs ($\oplus$), an OR gate 13 with two inputs, an AND gate 14 with two inputs, an AND gate 15 with two inputs, an AND gate 16 with two inputs and an inverting gate 17 (INV). These various gates are arranged to deliver the data bit b0 and the error bit e0 in accordance with the following relations:

$$b0 = [(b8 \oplus b4) \text{ AND } b4] \text{ OR } [\text{INV}(b8 \oplus b4) \text{ AND } b0]$$

$$e0 = [\text{INV}(b0 \text{ AND } b4 \text{ AND } b8)] \text{ AND } [b0 \text{ OR } b4 \text{ OR } b8]$$

Since the other circuits CT2, CT3, CT4 are of the same structure as the circuit CT1, they will not be described. They are distinguished from the circuit CT1 by the rank of bits received at input and by the rank of the bit delivered.

Variations and applications of the present invention will now be discussed. It will be understood that different variations and embodiments of the present invention may be made. In particular, although the description above was of a circuit ECCT1 that carries out an error correction by majority redundancy, one embodiment includes providing a circuit ECCT1 that solely carries out an error detection without bit correction. In this case, the circuit ECCT1 can operate according to the principle of simple redundancy, with a bit received at the input ES1 being duplicated in two bits only at the output ES2, as indicated below, for example:

$$b6' = b0' = b0$$

$$b7' = b1' = b1$$

$$b8' = b2' = b2$$

$$b9' = b3' = b3$$

$$b10' = b4' = b4$$

$$b11' = b5' = b5$$

In this case, the circuit ECCT1 does not solve the conflicts between two redundant bits and is limited to delivering the error signal ERR when two redundant bits are not equal. The error signal ERR is detected by the manager of the memory, such as a microprocessor for example, which can be programmed to definitively block itself when the error signal ERR is issued. In this case, it is considered that the memory is not valid and that the circuit into which it is integrated must be destroyed.

Moreover, although an interleaving of redundant bits was suggested above, a redundancy of non-interleaved bits can also be provided, as follows for example:

$b2'=b1'=b0'=b0$ $b5'=b4'=b3'=b1$ $b8'=b7'=b6'=b2$ $b11'=b10'=b9'=b3$

Also, although the description above was of an advantageous combination of an error detection and/or correction circuit ECCT1 operating according to the principle of simple or majority redundancy and of an error correction circuit ECCT2 using error correction codes, it goes without saying that the application to a non-erasable secure area of the circuit ECCT1 is an essential aspect of the present invention independent of the combination suggested, such that the circuit ECCT1 can be implemented without the circuit ECCT2. The circuit ECCT1 can also be implemented in combination with any other type of error correction circuit.

Also, it follows from the above that the present invention is applicable to all types of electrically erasable and programmable memories comprising a non-erasable secure area, particularly FLASH memories.

Figure 6:
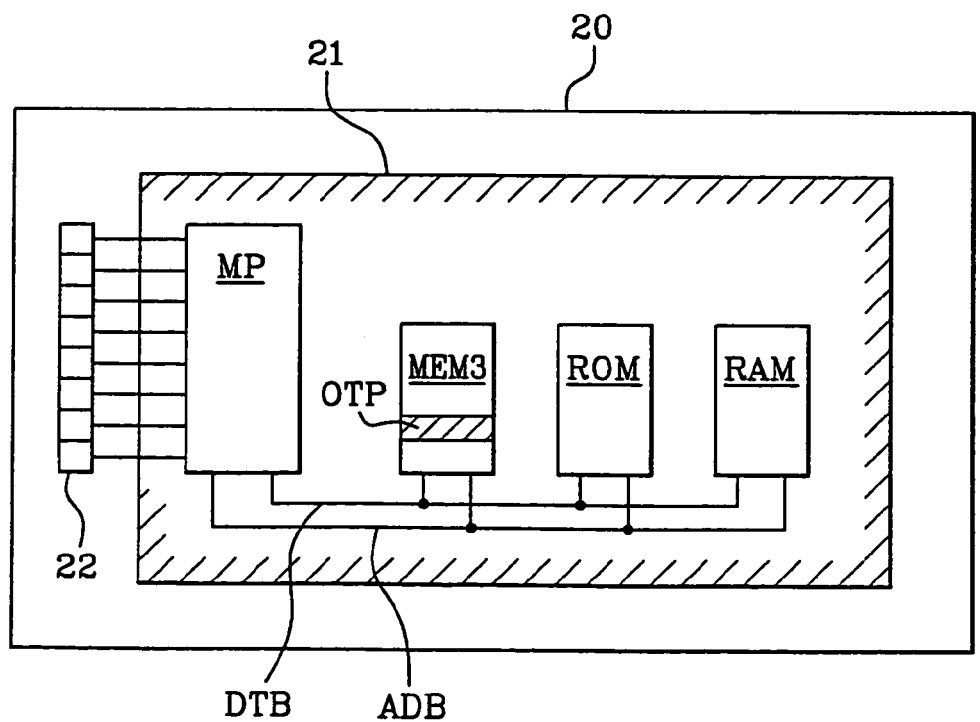
FIG. 6 schematically represents a smart card comprising a memory according to the present invention.

Finally, a memory according to the present invention is susceptible of various applications. It can particularly be integrated onto a silicon wafer in isolation or in association with other elements. As an example, FIG. 6 very schematically represents a smart card 20 comprising an integrated circuit 21 and contacts 22, such as eight ISO 7816 contacts for example. The integrated circuit 21 comprises a microprocessor MP, a memory MEM3 according to the present invention, a read-only memory ROM and a random access memory RAM. These different elements are connected to a data bus DTB and to an address bus ADB. In addition, the microprocessor MP comprises input/output ports connected to the contacts 22.

In this application, the OTP area of the memory MEM3 can be used during the steps of customizing the card 20 for the management of access to certain areas of memories MEM3, ROM or RAM. When the card 20 is commissioned, all the OTP bits are taken to 1 such that the access to the customization areas of the card is definitively locked.

That which is claimed is:

1. An electrically erasable and programmable memory comprising:
   a memory array comprising erasable and programmable zones and at least one non-erasable secured zone; and
   means for detecting and correcting read errors in said at least one non-erasable secured zone by recording a plurality of redundant bits corresponding to each programmed bit being recorded therein and generating at least one of an error signal and a bit having a majority value when the corresponding plurality of redundant bits read are not the same.

2. A memory according to claim 1, further comprising means for correcting read errors in said erasable and programmable zones by recording error correction codes therein in conjunction with reading a string of bits, and detecting and correcting an erroneous bit in the string of bits read.

3. A memory according to claim 2, wherein said means for detecting and correcting read errors in said at least one non-erasable secured zone comprises a first error detection circuit and a first error correction circuit dedicated thereto; and wherein said means for correcting read errors in said erasable and programmable zones comprises a second error correction circuit dedicated thereto.

4. A memory according to claim 3, further comprising a selection circuit having an input for receiving an address, and an output for providing a selection signal for selecting said first and second error correction circuits based upon a value of the address.

5. A memory according to claim 4, wherein said selection circuit protects said at least one non-erasable secured zone by generating a signal for inhibiting an erase operation when the address corresponds to said at least one non-erasable secured zone.

6. A memory according to claim 1, wherein said erasable and programmable zones each includes at least one string of M bits having N1 data bits and N2 error-correction code bits; and wherein said at least one-erasable secured zone includes at least one string of M bits having M/N3 redundant bits, with N3 being a redundancy rate.

7. A memory according to claim 1, wherein the plurality of redundant bits is equal to two redundant bits, which corresponds to generating the error signal.

8. A memory according to claim 1, wherein the plurality of redundant bits is equal to three redundant bits, which corresponds to generating the bit having a majority value.

9. A memory according to one claim 1, wherein said means for detecting and correcting read errors in said at least one non-erasable secured zone is configured so that the plurality of redundant bits are interlaced.

10. An electrically erasable and programmable memory comprising:
    a memory array comprising erasable and programmable zones and at least one non-erasable secured zone; and
    means for detecting read errors in said at least one non-erasable secured zone by recording a plurality of redundant bits corresponding to each programmed bit being recorded therein and generating an error signal when the corresponding plurality of redundant bits read are not the same.

11. A memory according to claim 10, further comprising means for correcting read errors in said erasable and programmable zones by recording error correction codes therein in conjunction with reading a string of bits, and detecting and correcting an erroneous bit in the string of bits read.

12. A memory according to claim 11, wherein said means for detecting read errors in said at least one non-erasable secured zone comprises a first error detection circuit dedicated thereto.

13. A memory according to claim 12, wherein said means for detecting read errors in said at least one non-erasable secured zone further comprises a first error correction circuit dedicated thereto.

14. A memory according to claim 13, wherein said means for correcting read errors in said erasable and programmable zones comprises a second error correction circuit dedicated thereto.

15. A memory according to claim 14, further comprising a selection circuit having an input for receiving an address, and an output for providing a selection signal for selecting said first and second error correction circuits based upon a value of the address.

16. A memory according to claim 15, wherein said selection circuit protects said at least one non-erasable secured zone by generating a signal for inhibiting an erase operation when the address corresponds to said at least one non-erasable secured zone.

17. A memory according to claim 10, wherein said erasable and programmable zones each includes at least one string of M bits having N1 data bits and N2 error-correction code bits; and wherein said at least one-erasable secured zone includes at least one string of M bits having M/N3 redundant bits, with N3 being a redundancy rate.

18. A memory according to claim 10, wherein the plurality of redundant bits is equal to two redundant bits.

19. A memory according to one claim 10, wherein said means for detecting read errors in said at least one non-erasable secured zone is configured so that the plurality of redundant bits are interlaced.

20. An integrated circuit comprising:
a microprocessor;
a memory connected to said microprocessor and comprising
a memory array comprising erasable and programmable zones and at least one non-erasable secured zone; and
a first error detection circuit and a first error correction circuit for detecting and correcting read errors in said at least one non-erasable secured zone by recording a plurality of redundant bits corresponding to each programmed bit being recorded therein and delivering at least one of an error signal and a bit having a majority value when the corresponding plurality of redundant bits read are not the same.

21. An integrated circuit according to claim 20, wherein said memory further comprises a second error correction circuit for detecting and correcting read errors in said erasable and programmable zones by recording error correction codes therein in conjunction with reading a string of bits, and detecting and correcting an erroneous bit in the string of bits read.

22. An integrated circuit according to claim 21, further comprising a selection circuit having an input for receiving an address, and an output for providing a selection signal for selecting said first and second error correction circuits based upon a value of the address.

23. An integrated circuit according to claim 22, wherein said selection circuit protects said at least one non-erasable secured zone by generating a signal for inhibiting an erase operation when the address corresponds to said at least one non-erasable secured zone.

24. An integrated circuit according to claim 20, wherein said erasable and programmable zones each includes at least one string of M bits having N1 data bits and N2 error-correction code bits; and wherein said at least one non-erasable secured zone includes at least one string of N bits having M/N3 redundant bits, with N3 being a redundancy rate.

25. An integrated circuit according to claim 20, wherein the plurality of redundant bits is equal to two redundant bits, which corresponds to the at least one signal being the error signal.

26. An integrated circuit according to claim 20, wherein the plurality of redundant bits is equal to three redundant bits, which corresponds to the at least one signal being the bit having a majority value.

27. An integrated circuit according to claim 20, wherein the integrated circuit is a smart card.

28. An integrated circuit comprising:
a microprocessor;
a memory connected to said microprocessor and comprising
a memory array comprising erasable and programmable zones and at least one non-erasable secured zone; and
a first error detection circuit for detecting read errors in said at least one non-erasable secured zone by recording a plurality of redundant bits corresponding to each programmed bit being recorded therein and delivering an error signal when the corresponding plurality of redundant bits read are not the same.

29. An integrated circuit according to claim 28, wherein said first error detection circuit further comprises a first error correction circuit.

30. An integrated circuit according to claim 29, wherein said memory further comprises a second error correction circuit for detecting and correcting read errors in said erasable and programmable zones by recording error correction codes therein in conjunction with reading a string of bits, and detecting and correcting an erroneous bit in the string of bits read.

31. An integrated circuit according to claim 30, further comprising a selection circuit having an input for receiving an address, and an output for providing a selection signal for selecting said first and second error correction circuits based upon a value of the address.

32. An integrated circuit according to claim 31, wherein said selection circuit protects said at least one non-erasable secured zone by generating a signal for inhibiting an erase operation when the address corresponds to said at least one non-erasable secured zone.

33. An integrated circuit according to claim 28, wherein said erasable and programmable zones each includes at least one string of M bits having N1 data bits and N2 error-correction code bits; and wherein said at least one non-erasable secured zone includes at least one string of M bits having M/N3 redundant bits, with N3 being a redundancy rate.

34. An integrated circuit according to claim 28, wherein the plurality of redundant bits is equal to two redundant bits.

35. An integrated circuit according to claim 28, wherein the integrated circuit is a smart card.

36. A method for detecting and correcting read errors in an electrically erasable and programmable memory comprising a memory array having erasable and programmable zones and at least one non-erasable secured zone, the method comprising:
recording a plurality of redundant bits in the at least one non-erasable secured zone corresponding to each programmed bit being recorded therein; and
reading the plurality of redundant bits corresponding to the programmed bit and generating at least one of an error signal and a bit having a majority value when the plurality of redundant bits read are not the same.

37. A method according to claim 36, further comprising correcting read errors in the erasable and programmable zones by recording error correction codes therein in conjunction with reading a string of bits, and detecting and correcting an erroneous bit in the string of bits read.

38. A method according to claim 37, wherein detecting and correcting read errors in the at least one non-erasable secured zone is performed using a first error correction circuit dedicated there; and wherein correcting read errors in the erasable zones is performed using a second error correction circuit dedicated thereto.

39. A method according to claim 38, further comprising providing a selection signal for selecting the first and second error correction circuits based upon a value of an address.

40. A method according to claim 36, wherein the erasable and programmable zones each includes at least one string of M bits having N1 data bits and N2 error-correction code bits; and wherein the at least one non-erasable secured zone includes at least one string of M bits having M/N3 redundant bits, with N3 being a redundancy rate.

41. A method according to claim 36, wherein the plurality of redundant bits is equal to two redundant bits, which corresponds to the error signal.

42. A method according to claim 36, wherein the plurality of redundant bits is equal to three redundant bits, which corresponds to the bit having a majority value.

43. A method for detecting read errors in an electrically erasable and programmable memory comprising a memory array having erasable and programmable zones and at least one non-erasable secured zone, the method comprising:
   recording a plurality of redundant bits in the at least one non-erasable secured zone corresponding to each programmed bit being recorded therein; and
   reading the plurality of redundant bits corresponding to the programmed bit and generating an error signal when the plurality of redundant bits read are not the same.

44. A method according to claim 43, further comprising correcting read errors in the erasable and programmable zones by recording error correction codes therein in conjunction with reading a string of bits, and detecting and correcting an erroneous bit in the string of bits read.

45. A method according to claim 44, wherein detecting read errors in the at least one non-erasable secured zone is performed using a first error detection circuit dedicated thereto.

46. A method according to claim 45, further comprising correcting read errors in the at least one non-erasable secured zone using a first error correction circuit dedicated there; and wherein correcting read errors in the erasable zones is performed using a second error correction circuit dedicated thereto.

47. A method according to claim 46, further comprising providing a selection signal for selecting the first and second error correction circuits based upon a value of an address.

48. A method according to claim 43, wherein the erasable and programmable zones each includes at least one string of M bits having N1 data bits and N2 error-correction code bits; and wherein the at least one non-erasable secured zone includes at least one string of M bits having M/N3 redundant bits, with N3 being a redundancy rate.

49. A method according to claim 43, wherein the plurality of redundant bits is equal to two redundant bits.

* * * * *

UNITED STATES PATENT AND TRADEMARK OFFICE
CERTIFICATE OF CORRECTION

PATENT NO. : 7,178,067 B2
APPLICATION NO. : 10/317005
DATED : February 13, 2007
INVENTOR(S) : Sylvie Wuidart Page 1 of 1

It is certified that error appears in the above-identified patent and that said Letters Patent is hereby corrected as shown below:

| | |
|---|---|
| Title Page Item (56), Other Publications | Delete: "Electrically Ersable and Programmable" Insert: --Electrically Erasable and Programmable-- |
| Column 2, Line 34 | Delete: "when-redundant bits" Insert: --when redundant bits-- |
| Column 4, Line 43 | Delete: "circuit DC" Insert: --circuit LTC-- |
| Column 7, Line 19 | Delete: "of three is in" Insert: --of three 1s in-- |
| Column 7, Line 49 | Delete: "through a buffer BUFL" Insert: --through a buffer BUF1-- |
| Column 7, Line 51 | Delete: "buffers BUFL," Insert: --buffers BUF1,-- |
| Column 11, Line 9 | Delete: "to one claim 10," Insert: --to claim 10,-- |

Signed and Sealed this

Twenty-first Day of August, 2007

JON W. DUDAS
*Director of the United States Patent and Trademark Office*